United States Patent
Kim et al.

(10) Patent No.: US 8,008,742 B2
(45) Date of Patent: Aug. 30, 2011

(54) SEMICONDUCTOR MEMORY DEVICE AND METHOD OF FABRICATING THE SAME

(75) Inventors: Hong-soo Kim, Yongin-si (KR); Su-in Baek, Seoul (KR); Seung-wook Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 12/457,500

(22) Filed: Jun. 12, 2009

(65) Prior Publication Data

US 2009/0309147 A1 Dec. 17, 2009

(30) Foreign Application Priority Data

Jun. 12, 2008 (KR) .................. 10-2008-0055432

(51) Int. Cl.
*H01L 21/762* (2006.01)
(52) U.S. Cl. ............... 257/501; 257/506; 257/E21.23
(58) Field of Classification Search .............. 257/501, 257/506, E21.23, E21.304
See application file for complete search history.

(56) References Cited

U.S. PATENT DOCUMENTS

| 6,281,050 | B1 * | 8/2001 | Sakagami | 438/142 |
| 2004/0195632 | A1 * | 10/2004 | Sato | 257/368 |
| 2009/0039402 | A1 * | 2/2009 | Jung et al. | 257/296 |

FOREIGN PATENT DOCUMENTS

| JP | 2001-176959 | 6/2001 |
| JP | 2002-198419 | 7/2002 |
| KR | 10-2007-0044284 | 4/2007 |

* cited by examiner

*Primary Examiner* — Jerome Jackson, Jr.
*Assistant Examiner* — Paul A Budd
(74) *Attorney, Agent, or Firm* — Harness, Dickey & Pierce, P.L.C.

(57) ABSTRACT

Provided are a semiconductor memory device whereby generation of dishing during planarization of a peripheral circuit region is suppressed, and a method of fabricating the semiconductor memory device. The semiconductor memory device includes a semiconductor substrate comprising a first active area in a memory cell region and a second active area in a peripheral circuit region; a plurality of first isolation films and a plurality of second isolation films protruding from a surface of the semiconductor substrate and defining the first active area and the second active area, respectively; and at least one polish stopper film formed within the second active area and protruding from the surface of the semiconductor substrate.

18 Claims, 5 Drawing Sheets

PERIPHERAL CIRCUIT REGION

PERIPHERAL CIRCUIT REGION

PERIPHERAL CIRCUIT REGION

PERIPHERAL CIRCUIT REGION

SEMICONDUCTOR MEMORY DEVICE AND METHOD OF FABRICATING THE SAME

CROSS-REFERENCE TO RELATED APPLICATIONS

This application claims priority under 35 U.S.C. §119 to Korean Patent Application No. 10-2008-0055432, filed on Jun. 12, 2008, in the Korean Intellectual Property Office (KIPO), the entire contents of which are incorporated herein by reference.

BACKGROUND

1. Field

Example embodiments relate to a semiconductor memory device and a method of fabricating the same, and more particularly, to a semiconductor memory device and a method of fabricating the semiconductor memory device in which the generation of dishing during planarization of a peripheral circuit region is suppressed or minimized.

2. Description of the Related Art

Flash memory is a semiconductor memory device which has a specific type of an electrically erasable and programmable read-only memory (EEPROM). A typical flash memory includes a memory cell region having a plurality of memory cells which include floating gates and may be electrically erased and reprogrammed.

In the peripheral circuit region adjacent to the memory cell region, a driving circuit for driving the memory cells, a logic circuit for processing the information of the memory cells, and other devices are arranged. For example, memory cell strings may be provided in the memory cell region, and various driving circuits and logic circuits, which include active devices, e.g., transistors, or passive devices, e.g., resistors and capacitors, may be provided in the peripheral circuit region in order to implement a NAND flash device.

Typically, to manufacture such a memory device, first, an isolation film is formed in a semiconductor substrate to define an active area of a memory cell region and an active area of a peripheral circuit region. Thereafter, an insulation film, e.g., a silicon oxide film, is formed on the active areas, and a conductive film is deposited on the insulation film. Then, the conductive film may be planarized by performing a chemical mechanical polishing (CMP) process until an upper surface of the isolation film is exposed.

After the CMP process, a portion of the conductive film on the active area of the peripheral circuit region may be over-etched due to a difference between pattern densities of the memory cell region and the peripheral circuit region, resulting in dishing in the peripheral circuit region. In addition, a step difference between the memory cell region and the peripheral circuit region may be caused. In particular, for flash memory devices, a distance between memory cells is reduced according to the scaling down of the integrated devices, and, therefore, the thickness of a floating gate gradually decreases to reduce interference between memory cells. Consequently, the difference between the pattern densities of the memory cell region and the peripheral circuit region increases and, therefore, over-etching of the peripheral circuit region during the CMP process limits considerably the advance in capacity and integration of flash memory devices.

Due to over-etching caused by the CMP process, a portion of the insulation film below the conductive film in the peripheral circuit region is exposed, or the active area of the peripheral circuit region is exposed, which may lead to a reduction of the reliability of the semiconductor memory device and broad scattering of the device performance. The step difference between the memory cell region and the peripheral circuit region which is caused by the CMP process may impede securing a sufficient defocus margin in a subsequent process, e.g., a photolithography step for forming an interlayer insulation film and a wiring layer. To address these problems, a technique of reducing the difference between the pattern densities of the memory cell region and the peripheral circuit region by increasing the width of an isolation film in the peripheral circuit region has been proposed. However, this technique is not suitable for improving the integration of memory devices.

SUMMARY

Example embodiments include a method of fabricating a semiconductor memory device, whereby over-etching of a peripheral circuit region caused by a difference between pattern densities of a memory cell region and the peripheral circuit region during the planarization process may be suppressed or reduced.

The method may include providing a semiconductor substrate including a memory cell region and a peripheral circuit region, forming a plurality of first and second isolation films that protrude from a surface of the semiconductor substrate, the plurality of first and second isolation films defining the memory cell region and the peripheral circuit region, respectively and forming at least one polish stopper film within the second active area, the at least one polish stopper film protruding from the surface of the semiconductor substrate.

In example embodiments, the plurality of first and second isolation films may include shallow trench isolation films. The plurality of first and second isolation films and the at least one polish stopper film may also be formed simultaneously.

In example embodiments, the method may further include forming a first insulation film and a second insulation film on the first active area and the second active area, respectively. The first insulation film and the second insulation film may be formed simultaneously. In addition, the first insulation film may include a tunneling insulation film, a charge storage film and a blocking insulation film.

In example embodiments, the method may further include forming a conductive film on the first insulation film and the second insulation film. The conductive film may cover the plurality of first and second insulation films and the at least one polish stopper film while filling spaces between the first isolation films and spaces between the second isolation film and the polish stopper film. In example embodiments, the method may further include performing a chemical mechanical polishing (CMP) process on the conductive film until surfaces of the first and second isolation films and the polish stopper film are exposed.

Example embodiments include a semiconductor memory device. The semiconductor memory system may include a semiconductor substrate including a first active area in a memory cell region and a second active area in a peripheral circuit region, and a plurality of first and second isolation films protruding from a surface of the semiconductor substrate. The plurality of the first and second isolation films may define the first active area and the second active area, respectively. The semiconductor memory system may further include at least one polish stopper film formed within the second active area. The at least one polish stopper film protruding from the surface of the semiconductor substrate.

In example embodiments, the second active area in which the at least one polish stopper film is formed may be an area where a capacitor is formed. The polish stopper film may extend from the second isolation film into the second active area. Alternately, the polish stopper film may be separated from the second isolation film and formed within the second active area.

In example embodiments, the plurality of first and second isolation films and the at least one polish stopper film are formed to protrude from the surface of the semiconductor substrate at the same height.

In example embodiments, the heights of the plurality of first and second isolation films and the at least one polish stopper film protrude from the surface of the semiconductor substrate at about 0.1-about 0.2 μm.

BRIEF DESCRIPTION OF THE DRAWINGS

Example embodiments will be more clearly understood from the following detailed description taken with reference to the accompanying drawings in which.

DETAILED DESCRIPTION OF EXAMPLE EMBODIMENTS

Figure 1A:
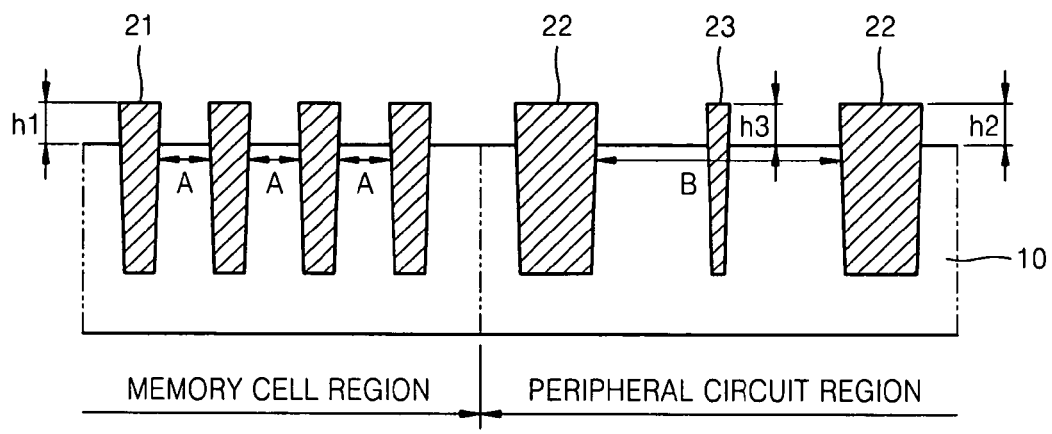
FIGS. 1A through 1D are cross-sectional views illustrating a method of manufacturing a semiconductor memory device, according to example embodiments.

Example embodiments will now be described more fully hereinafter with reference to the accompanying drawings, in which example embodiments are shown. However, example embodiments should not be construed as being limited to the embodiments set forth herein. Rather, these embodiments are provided so that this disclosure will be thorough and complete, and will fully convey the scope of the present invention to those of ordinary skill in the art.

It will be understood that when an element such as a layer, region or substrate is referred to as being "on" another element, it can be directly on the other element or intervening elements may also be present. In the drawings, the thickness or sizes of layers are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to drawings that schematically illustrate idealized embodiments of the present invention. In the drawings, modification of the illustrated shapes may be expected according to the manufacturing technique and/or tolerance of the embodiments. Accordingly, example embodiments should not be construed as being limited to the particular forms in the illustrated drawings, and should include changes in the shape caused during the manufacturing process.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIGS. 1A through 1D are cross-sectional views illustrating a method of manufacturing a semiconductor memory device, according to example embodiments. Referring to FIG. 1A, a semiconductor substrate 10 may include a first active area A in a memory cell region and a second active area B in a peripheral circuit region. The first active area A may be defined by first isolation films 21 each protruding from the surface of the semiconductor substrate 10 by a height h1. The second active area B may be defined by second isolation films 22 each protruding from the surface of the semiconductor substrate 10 by a height h2. An polish stopper film 23 protruding from the surface of the semiconductor substrate 10 by a height h3 may be formed within the second active area B defined by the second isolation films 22.

According to example embodiments, the heights h1, h2, and h3 by which the first and second isolation films 21 and 22 and the polish stopper film 23 respectively protrude from the surface of the semiconductor substrate 10 may be about 0.1-about 0.2 μm. If the first and second isolation films 21 and 22 and the polish stopper film 23 are formed simultaneously, these films 21, 22 and 23 may protrude from the surface of the semiconductor substrate 10 by the same height.

As is well known in the art, the first and second isolation films 21 and 22 and the polish stopper film 23 may be formed using shallow trench isolation (STI). For example, the semiconductor substrate 10 may be etched to a depth of about 0.2-about 0.5 μm to form trenches, and the trenches may be filled with an insulation material, for example, silicon oxide, may be patterned, and may be optionally planarized, resulting in the first and second isolation films 21 and 22 and the polish stopper film 23.

Figure 1B:
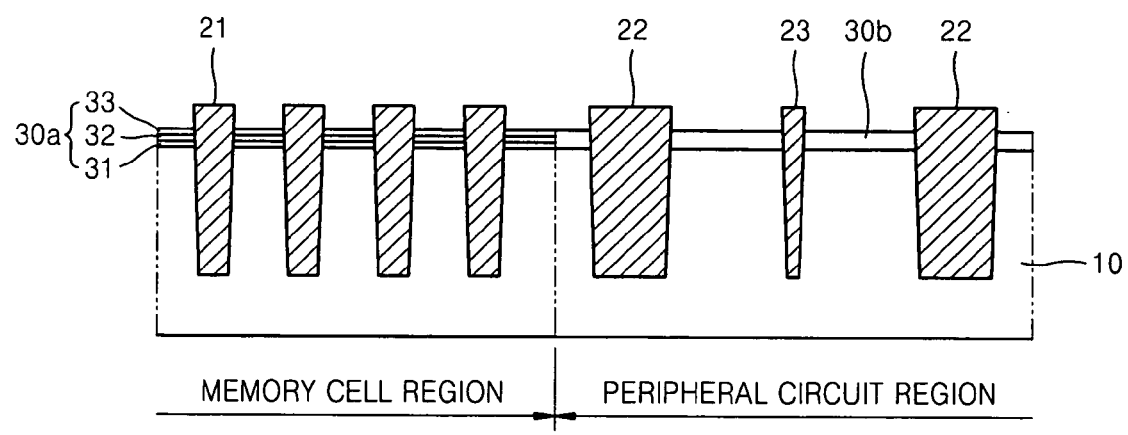

Referring to FIG. 1B, at least one first insulation film 30a may be formed on the first active area A in the memory cell region. If the semiconductor memory device to be formed is a SONOS nonvolatile memory device, the first insulation film 30a may include a tunneling insulation film 31, a charge storage film 32, and a blocking insulation film 33. However, the tunneling insulation film 31, the charge storage film 32, and the blocking insulation film 33 are only illustrative, and example embodiments are not limited thereto. For example, the first insulation film 30a may include only the tunneling insulation film 31 to form a floating gate type nonvolatile memory device. In other example embodiments, according to a method of driving the memory device, the order in which the tunneling insulation film 31 and the blocking insulation film 33 are stacked may be reversed. In example embodiments, other insulation films or a conductive film may be further interposed between the tunneling insulation film 31, the charge storage film 32, and the blocking insulation film 33.

A second insulation film 30b may be formed on the second active area B. The second insulation film 30b may be a dielectric film used to form a capacitor as a peripheral circuit. According to example embodiments, the second insulation film 30b may be formed while the first insulation film 30a is being formed. In this regard, the second insulation film 30b may be formed while the tunneling insulation film 31 of the first insulation film 30a is being formed.

Figure 1C:
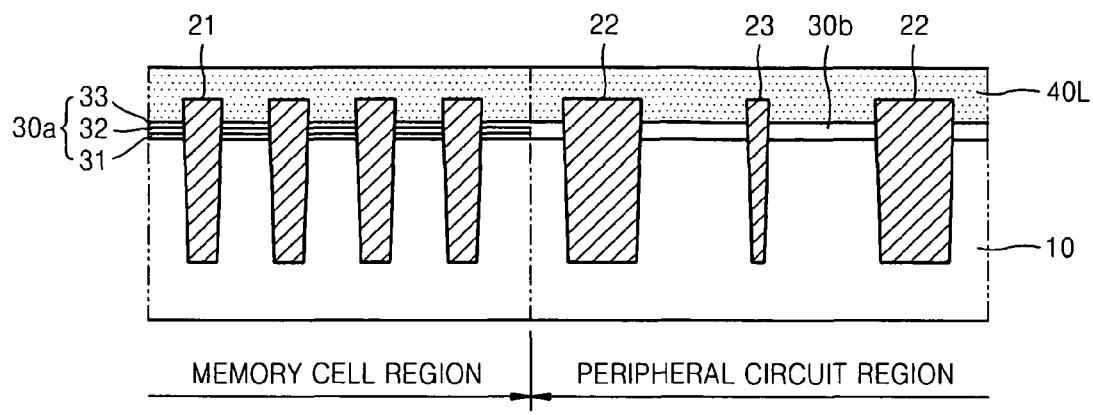

Referring to FIG. 1C, after the first insulation film 30a and the second insulation film 30b are formed on the first active area A and the second active area B, respectively, as described above, a conductive film 40L may be formed to cover the first and second isolation films 21 and 22 and the polish stopper film 23 while filling spaces between the first isolation films 21 and spaces between the second isolation film 22 and the polish stopper 23. The conductive film 40L may be formed of doped polysilicon. However, example embodiments are not limited to the doped polysilicon, and the conductive film 40L may also be formed of a well-known electrode material, for example, Al, Pt, Pd, Ni, Ru, Co, Cr, Mo, W, Mn, Fe, Ru, Os, Ph, Ir, Ta, Au, or Ag, an alloy of each of the foregoing, or a conductive oxide of each of the foregoing.

Figure 1D:
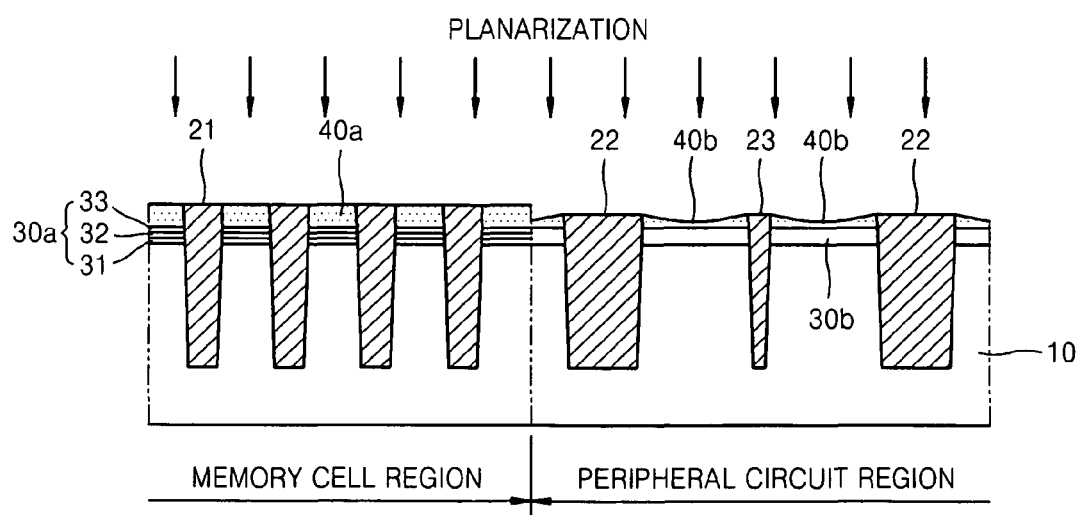

Referring to FIG. 1D, as indicated by arrows, a chemical mechanical polishing (CMP) process as a planarization process, may be performed on the conductive film 40L. The planarization process may be performed until surfaces of the first and second isolation films 21 and 22 and the polish stopper film 23 are exposed.

According to the planarization process, first and second conductive film patterns 40a and 40b may be formed between the first isolation films 21 and between the second isolation film 22 and the polish stopper film 23, respectively. The first conductive film pattern 40a may be a control gate electrode of a nonvolatile memory device. As described above, if the first insulation film 30a includes the tunneling insulation film 31, the first conductive film pattern 40a may be a floating gate electrode. As such, a gate stack of a memory cell transistor may be provided by the first insulation film 30a and the first conductive film pattern 40a.

If strings of the memory cell transistors serially connected to one another are formed within the first active area A, a flash memory having a "NAND" architecture may be implemented. However, this is just an example, and example embodiments may be applied to a flash memory having a "NOR" architecture.

A capacitor including the second active area B, a second insulation film 30b, and the second conductive film pattern 40b may be formed within the peripheral circuit region. More specifically, the second active area B may serve as a lower electrode of the capacitor by including an N+ conductive region, the second insulation film 30b may serve as a dielectric film of the capacitor, and the second conductive film pattern 40b may serve as an upper electrode of the capacitor.

According to example embodiments, the polish stopper film 23 formed within the second active area B defined by the second isolation films 22 may reduce or remove a difference between pattern densities of the first isolation film 21 and the second isolation film 22. As a result, the planarization process may be performed without a dishing within the peripheral circuit region. Without exposure of the surfaces of the second insulation film 30b and/or the second active area B, an undamaged peripheral circuit, e.g., a capacitor, may be formed in the peripheral circuit region. If the polish stopper film 23 is formed on a relatively wide active area where a capacitor is to be formed, damage of the capacitor and other peripheral circuits adjacent to the capacitor may be prevented or reduced. Various polish stopper films according to example embodiments will now be described.

FIGS. 2A through 2D are plan views of various polish stopper films 23a, 23b, 23c, and 23d according to example embodiments. FIGS. 2A through 2D only illustrate a peripheral circuit region to clearly describe the structures of the polish stopper films 23a, 23b, 23c, and 23d.

Figure 2A:
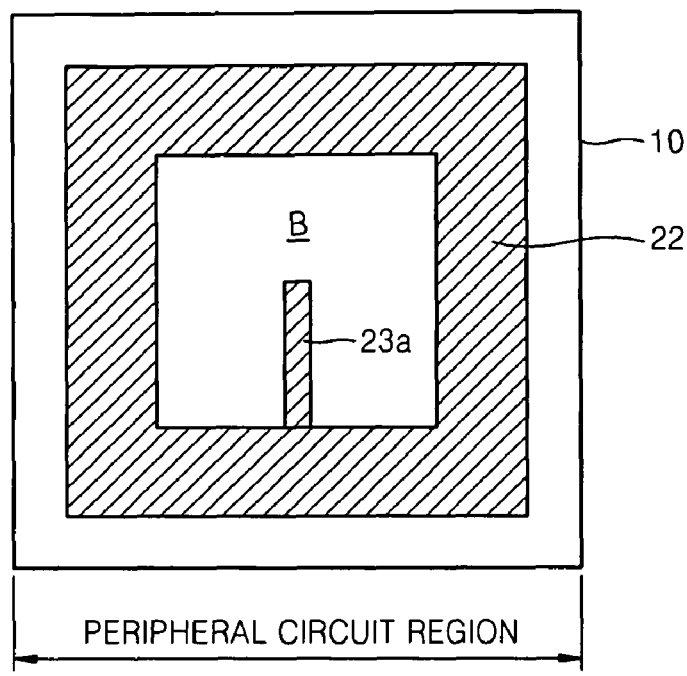
FIGS. 2A through 2D are plan views of various polish stopper films according to example embodiments.
Figure 2B:
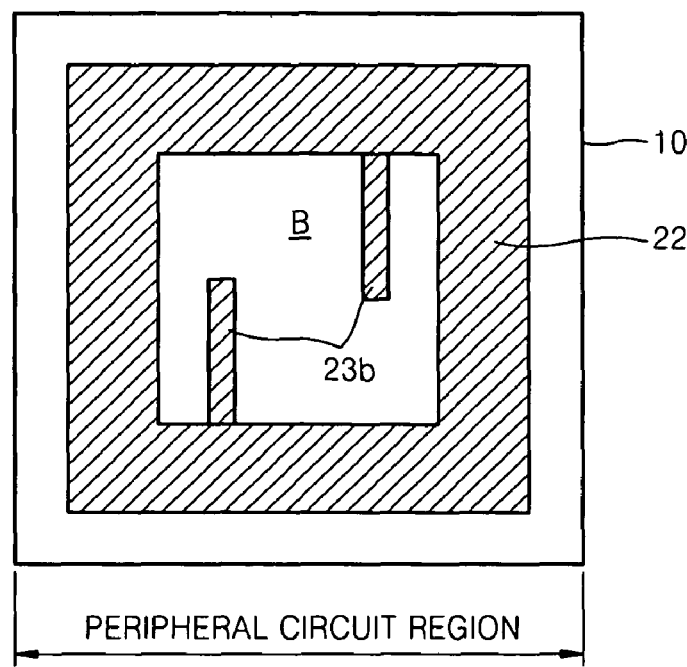

In example embodiments, the polish stopper film 23a, as illustrated in FIG. 2A, may extend from a second isolation film 22 into a second active area B, and at least two polish stopper films 23b, as illustrated in FIG. 2B, may be arranged to reduce the difference between the pattern densities of the memory cell region and the peripheral circuit region.

Figure 2C:
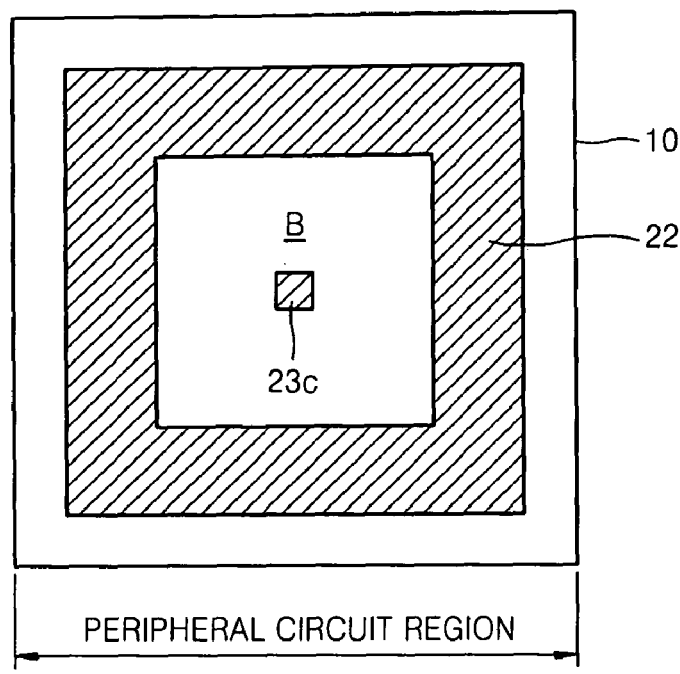
Figure 2D:
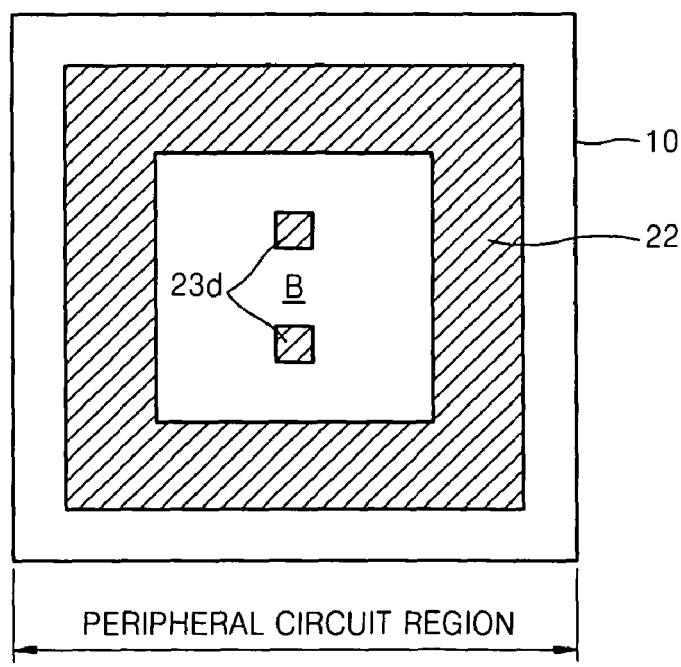

In other example embodiments, the polish stopper film 23c, as illustrated in FIG. 2C, may be formed within the second active area B while the polish stopper film 23c may be separated from the second isolation film 22 and, and at least two polish stopper films 23d, as illustrated in FIG. 2D, may be disposed within the second active area B. Any combination of the illustrated polish stopper films 23a through 23d may be employed in example embodiments. The polish stopper films 23a through 23d may have various shapes. For example, though the polish stopper films 23c and 23d have the shape of square pillars with a squared cross section view as illustrated in FIGS. 2C and 2D, these polish stopper films 23c and 23d may be cylindrical pillars with a circular cross section view.

Figure 3:
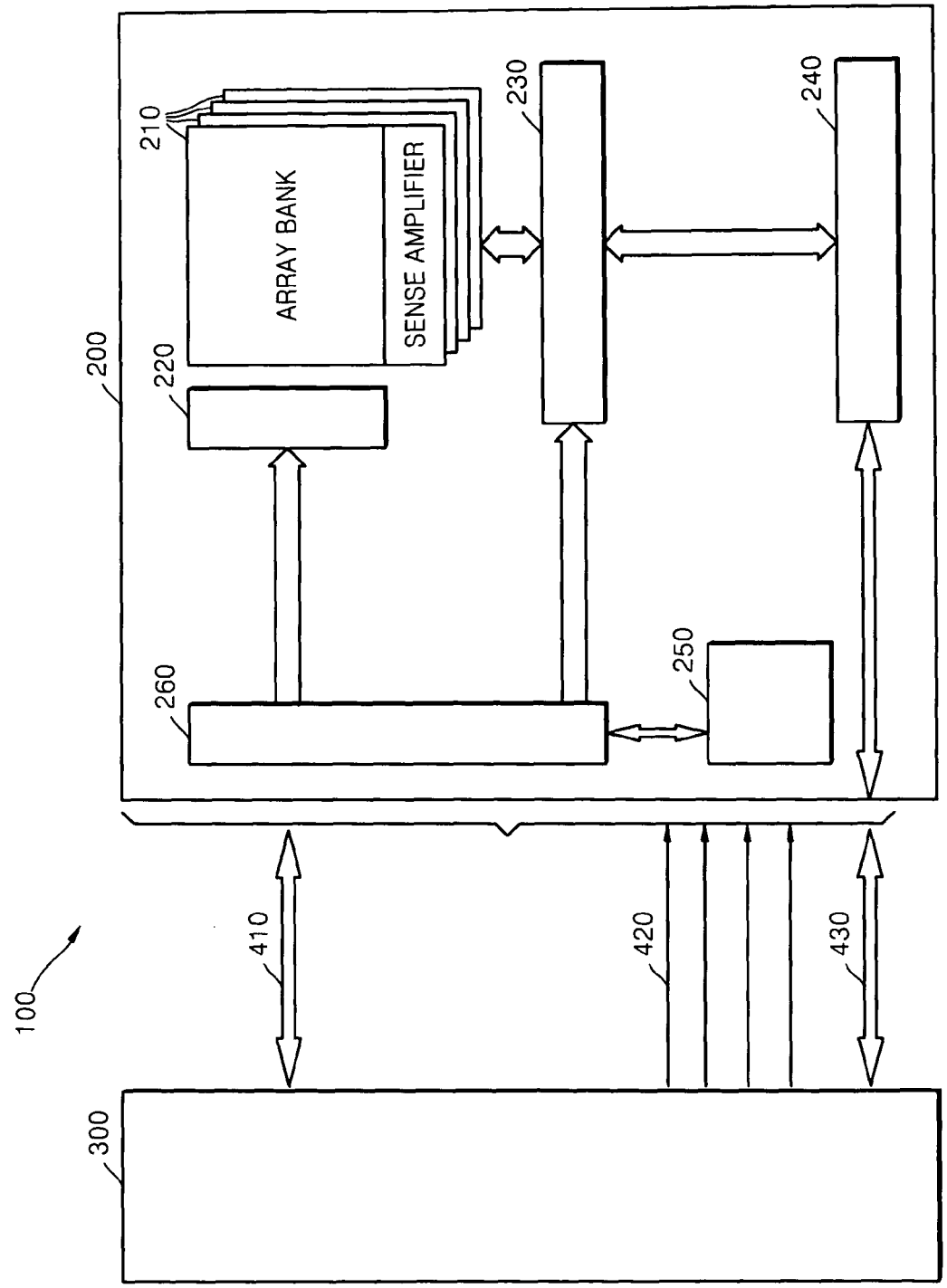
FIG. 3 is a block diagram of a system including a semiconductor memory device according to example embodiments.

FIG. 3 is a block diagram of a system 100 including a semiconductor memory device 200 according to example embodiments. Referring to FIG. 3, the semiconductor memory device 200 including a memory cell region and a peripheral circuit region according to example embodiments may have a "NAND" or "NOR" architecture array according to a logic gate design, as is well known in the art. Each of a plurality of memory banks 210 may include an array bank made up of a plurality of memory cells arranged in a plurality of rows and columns, and a sense amplifier for detecting a signal from the array bank. As is well known in the art, the semiconductor memory device 200 may include a row decoder 220, a column decoder 230, an input/output (I/O) buffer 240, a control unit 250, and a control register 260.

The semiconductor memory device 200 may be generally coupled with a host 300 which may be a processing device, e.g., a micro-processor, or a memory controller. The semiconductor memory device 200 may further include an address interface 410, a control interface 420, and a data interface 430 through which the host 300 accesses the semiconductor memory device 200 to perform data reading and writing. The address interface 410, the control interface 420, and the data interface 430 may be variously modified as is well known in the art. For example, the address interface 410, the control interface 420, and the data interface 430 may be synchronous interfaces, e.g., SDRAM or DDR-SDRAM interfaces.

While example embodiments have been particularly shown and described with reference to example embodiments thereof, it will be understood that various changes in form and details may be made therein without departing from the spirit and scope of the following claims.

What is claimed is:

1. A semiconductor memory device comprising:
   a semiconductor substrate including a first active area in a memory cell region and a second active area in a peripheral circuit region;
   a plurality of first and second isolation films protruding from a surface of the semiconductor substrate, the plurality of the first and second isolation films defining the first active area and the second active area, respectively; and at least one polish stopper film formed within the second active area, the at least one polish stopper film protruding from the surface of the semiconductor substrate, wherein the at least one polish stopper film extends from at least one second isolation film of the plurality of second isolation films into the second active area.

2. The semiconductor memory device of claim 1, wherein a capacitor is formed in the second active area in which the at least one polish stopper film is formed.

3. The semiconductor memory device of claim 1, further comprising:
a first insulation film on the first active area; and
a gate electrode on the first insulation film.

4. The semiconductor memory device of claim 3, wherein the first insulation film includes a tunneling insulation film, a charge storage film, and a blocking insulation film.

5. The semiconductor memory device of claim 4, wherein the charge storage film includes a conductive film or a charge trapping layer.

6. The semiconductor memory device of claim 1, further comprising:
a second insulation film on the second active area; and
an upper electrode on the second insulation film.

7. The semiconductor memory device of claim 1, wherein the plurality of first and second isolation films and the at least one polish stopper film protrude from the surface of the semiconductor substrate at the same height.

8. The semiconductor memory device of claim 7, wherein the heights of the plurality of first and second isolation films and the at least one polish stopper film protrude from the surface of the semiconductor substrate at about 0.1-about 0.2 μm.

9. The semiconductor memory device of claim 1, wherein the at least one polish stopper film is separated from the plurality of second isolation films and within the second active area.

10. A method of manufacturing a semiconductor memory device, the method comprising:
providing a semiconductor substrate including a memory cell region and a peripheral circuit region;
forming a plurality of first and second isolation films configured to protrude from a surface of the semiconductor substrate, the plurality of first and second isolation films defining the memory cell region and the peripheral circuit region; and
forming at least one polish stopper film within the second active area, the at least one polish stopper film protruding from the surface of the semiconductor substrate,
wherein the at least one polish stopper film extends from at least one second isolation film of the plurality of second isolation films into the second active area.

11. The method of claim 10, wherein the plurality of first and second isolation films include shallow trench isolation films.

12. The method of claim 10, wherein the plurality of first and second isolation films and the at least one polish stopper film are formed simultaneously.

13. The method of claim 10, further comprising:
forming a first insulation film and a second insulation film on the first active area and the second active area, respectively.

14. The method of claim 13, wherein the first insulation film and the second insulation film are formed simultaneously.

15. The method of claim 13, wherein the first insulation film includes a tunneling insulation film, a charge storage film and a blocking insulation film.

16. The method of claim 13, further comprising:
forming a conductive film on the first insulation film and the second insulation film, the conductive film covering the first and second insulation films and the at least one polish stopper film while filling spaces between the plurality of first isolation films and spaces between the plurality of second isolation films and the at least one polish stopper film.

17. The method of claim 16, further comprising:
performing a chemical mechanical polishing (CMP) process on the conductive film until surfaces of the plurality of first and second isolation films and the at least one polish stopper film are exposed.

18. The method of claim 10, wherein the at least one polish stopper film is separated from the plurality of second isolation films and within the second active area.

* * * * *